(12) United States Patent
Wu et al.

(10) Patent No.: US 7,307,304 B2
(45) Date of Patent: Dec. 11, 2007

(54) FERROELECTRIC MATERIALS AND FERROELECTRIC MEMORY DEVICE MADE THEREFROM

(75) Inventors: Tai-Bor Wu, Hsinchu (TW); Cheng-Lung Hung, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 91 days.

(21) Appl. No.: 11/150,854

(22) Filed: Jun. 9, 2005

(65) Prior Publication Data

US 2005/0285171 A1 Dec. 29, 2005

(30) Foreign Application Priority Data

Jun. 11, 2004 (TW) ............... 93116892 A

(51) Int. Cl.
*H01L 29/76* (2006.01)

(52) U.S. Cl. ............ 257/295; 257/288; 257/296; 257/297; 257/298; 257/303; 257/306; 361/321; 365/145

(58) Field of Classification Search ............ None
See application file for complete search history.

(56) References Cited

U.S. PATENT DOCUMENTS

| 5,155,658 A | 10/1992 | Inam et al. ............ 361/321 |
| 5,248,564 A | 9/1993 | Ramesh ............ 428/688 |
| 5,403,461 A * | 4/1995 | Tuller et al. ............ 204/252 |
| 5,519,235 A | 5/1996 | Ramesh ............ 257/295 |
| 5,838,035 A | 11/1998 | Ramesh ............ 257/295 |
| 6,194,228 B1 | 2/2001 | Fujiki et al. ............ 438/3 |
| 6,440,324 B1 * | 8/2002 | Hayashi et al. ....... 252/62.9 PZ |

* cited by examiner

*Primary Examiner*—Sue A. Purvis
*Assistant Examiner*—Fazli Erdem
(74) *Attorney, Agent, or Firm*—Ladas & Parry LLP

(57) ABSTRACT

A ferroelectric material includes a compound of formula (I):

$$(Pb_{1-x-z}Ba_zA_x)(B_yZr_{1-y})O_3, \qquad (I)$$

wherein $0 \leq x \leq 0.1$, $0 \leq y \leq 0.020$, $0.15 \leq z \leq 0.35$, with the proviso that $y \neq 0$ when $x=0$, and that $x \neq 0$, when $y=0$; and wherein A is a first element having a valence number greater than that of Pb, and B is a second element having a valence number greater than that of Zr. A ferroelectric memory device made from the ferroelectric material is also disclosed.

11 Claims, 3 Drawing Sheets

FERROELECTRIC MATERIALS AND FERROELECTRIC MEMORY DEVICE MADE THEREFROM

CROSS-REFERENCE TO RELATED APPLICATION

This application claims priority of Taiwanese application no. 093116892, filed on Jun. 11, 2004.

BACKGROUND OF THE INVENTION

1. Field of the Invention

This invention relates to a ferroelectric material, more particularly to a ferroelectric material having a lead barium zirconate-based modified structure so as to improve fatigue resistance thereof. This invention also relates to a ferroelectric memory device made from the ferroelectric material.

2. Description of the Related Art

Nowadays, in view of rapid development in semiconductor processing techniques, there is a surge of interest in searching for ferroelectric materials to meet the requirements for reducing volume and size of a memory device. In recent development of memories, attention has been drawn to the manufacture of non-volatile semiconductor memories by using ferroelectric materials that exhibit a polarization hysteresis having two stable electrical polarization states.

In application of the ferroelectric materials, such as lead zirconate titanate, to a ferroelectric memory device, since lead zirconate titanate ($Pb(Zr_x, Ti_{1-x})O_3$, PZT) is characterized by a relatively high remanent polarization ($P_r$) and a high Curie temperature ($T_c$) with respect to the operating temperature, PZT is useful for manufacturing of the ferroelectric memory device having a Pt/PZT/Pt capacitor. However, although such ferroelectric memory device has high remanent polarization, the switched polarization ($\Delta P$) will decrease with an increase in switching cycles after repeated switching at a predetermined voltage. As such, the applied coercive field ($E_c$) of the ferroelectric memory device is required to be increased accordingly, which, in turn, results in poor fatigue resistance.

In detail, since oxygen vacancies accumulated at the interface between the PZT film and the metal electrode layers during switching cycles, movement of domains included in the ferroelectric memory device tends to be adversely affected, which can result in deterioration of the fatigue resistance. Formation of such oxygen vacancies is related to reduction of $Ti^{4+}$ to $Ti^{3+}$ in PZT during manufacture of the ferroelectric memory device. Conductive metal oxides, such as (La, Sr) $CoO_3$ (LSCO), $SrRuO_3$ (SRO), and $YBa_2Cu_3O_{7-x}$ (YBCO), that have a perovskite structure similar to that of PZT, can be used for manufacturing metal electrode layers, so as to improve the fatigue resistance of the ferroelectric memory device.

For example, U.S. Pat. Nos. 5,519,235, 5,248,564 and 5,838,035 describe a ferroelectric memory device including a LSCO/PZT/LSCO capacitor. U.S. Pat. Nos. 6,194,228 and 5,155,658 describe a ferroelectric memory device including a SRO/PZT/SRO capacitor and a YBCO/PZT/YBCO capacitor, respectively. The entire contents of these prior art Patents are incorporated herein by reference.

However, even though the fatigue resistance of the ferroelectric memory device mentioned in these prior art Patents can be improved by using the conductive metal oxides as the electrode layers, the manufacture of such ferroelectric memory device requires a relatively high sputtering or depositing temperature, e.g., about 600° C. to 810° C., and complicated processing steps.

Therefore, there is still a need in the art to provide a ferroelectric material that is capable of forming a ferroelectric memory device with good fatigue resistance and high remanent polarization.

SUMMARY OF THE INVENTION

The object of the present invention is to provide a ferroelectric material that is clear of the abovementioned drawbacks of the prior art, and a ferroelectric memory device made therefrom.

According to one aspect of this invention, a ferroelectric material includes a compound of formula (I)

$$(Pb_{1-x-z}Ba_zA_x)(B_yZr_{1-y})O_3 \qquad (I)$$

wherein $0 \leq x \leq 0.1$, $0 \leq y \leq 0.020$, $0.15 \leq z \leq 0.35$, with the proviso that $y \neq 0$ when $x=0$, and that $x \neq 0$, when $y=0$; and wherein A is a first element having a valence number greater than that of Pb, and B is a second element having a valence number greater than that of Zr.

According to another aspect of this invention, a ferroelectric memory device includes a base, a ferroelectric layer formed on the base, and first and second electrode layers coupled to the ferroelectric layer. The ferroelectric layer is formed of a ferroelectric material including a compound of formula (I):

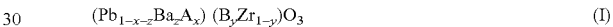

$$(Pb_{1-x-z}Ba_zA_x)(B_yZr_{1-y})O_3 \qquad (I)$$

wherein $0 \leq x \leq 0.1$, $0 \leq y \leq 0.020$, $0.15 \leq z \leq 0.35$, with the proviso that $y \neq 0$ when $x=0$, and that $x \neq 0$, when $y=0$; and wherein A is a first element having a valence number greater than that of Pb, and B is a second element having a valence number greater than that of Zr.

BRIEF DESCRIPTION OF THE DRAWINGS

Other features and advantages of the present invention will become apparent in the following detailed description of the preferred embodiment of the invention, with reference to the accompanying drawings. In the drawings.

DETAILED DESCRIPTION OF THE PREFERRED EMBODIMENT

A ferroelectric crystal contains a plurality of domains confined by domain walls. When an electric field (E) is applied to the ferroelectric crystal, domains will move in a direction parallel to the direction of the applied electric field so as to produce a net polarization. However, defects formed in the ferroelectric crystal, such as oxygen vacancies, will restrain motion of the domains along with the applied electric field and result in a relatively low $P_r$ value. An increase in the applied electric field is required to compensate for the restraints of the defects so as to obtain a relatively high $P_r$ value.

In addition, since the chemical structure of lead barium zirconate (PBZ) is based on chemically stable $Zr^{4+}$, unlike $Ti^{3+}$ that is easily reduced, formation of oxygen vacancies can be avoided. Film made from PBZ has a structure similar to that made from PZT and can be manufactured at a relatively low temperature.

Armed with the above knowledge, the inventors of the present invention conceived that restraints of motion of the domains in the PBZ ferroelectric crystal due to formation of oxygen vacancies can be abated by replacing a portion of $Pb^{2+}$ with a first element having a valence number greater than that of Pb, or by replacing a portion of $Zr^{4+}$ with a second element having a valence number greater than that of Zr, or both. In detail, the first and second elements act as donor dopants for replacing $Pb^{2+}$ and $Zr^{4+}$, respectively, in the ferroelectric crystal, and can produce excess negative charge compensation for inhibiting formation of oxygen vacancies. Therefore, the ferroelectric material consisted of such ferroelectric crystal can exhibit a high fatigue-resistance property.

The preferred embodiment of a ferroelectric material according to this invention includes a compound of formula (I)

$$(Pb_{1-x-z}Ba_zA_x)(B_yZr_{1-y})O_3 \qquad (I)$$

wherein $0 \leq x \leq 0.1$, $0 \leq y \leq 0.020$, $0.15 \leq z \leq 0.35$, with the proviso that $y \neq 0$ when $x=0$, and that $x \neq 0$, when $y=0$; and wherein A is a first element having a valence number greater than that of Pb, and B is a second element having a valence number greater than that of Zr.

Preferably, the first element has a valence number of three and is selected from the group consisting of $La^{3+}$, $Nd^{3+}$, $Fe^{3+}$, and combinations thereof. The second element has a valence number of 5 and is selected from the group consisting of $Nb^{5+}$, $Ta^{5+}$, $V^{5+}$, and combinations thereof.

More preferably, in the above formula (I), $x=0$, $0.01 \leq y \leq 0.018$, and the second element is $Nb^{5+}$.

Figure 1:
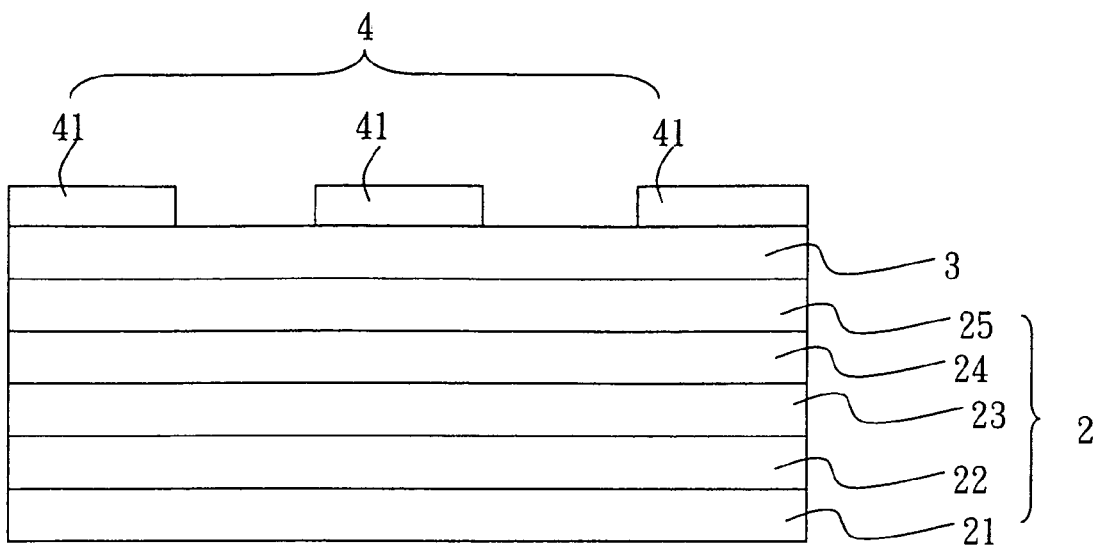
FIG. 1 is a schematic view to illustrate the preferred embodiment of a ferroelectric memory device according to the present invention.

Referring to FIG. 1, the preferred embodiment of a ferroelectric memory device includes a base 2, a ferroelectric layer 3 formed on the base 2, and a first electrode layer 4 formed on the ferroelectric layer 3. The ferroelectric layer 3 is formed of a ferroelectric material including a compound of formula (I) as defined above.

Preferably, the base 2 includes a silicon substrate 21, an insulator layer 22 formed on the silicon substrate 21, and a second electrode layer 25 disposed between the insulator layer 22 and the ferroelectric layer 3. The second electrode layer 25 may be made from a conductive material selected from the group consisting of Pt, LNO, LSCO, SRO and YBCO. Preferably, the insulator layer 22 is made from $SiO_2$, and the second electrode layer 25 is made from Pt.

More preferably, the base 2 further includes a buffer layer 23 that is formed between the insulator layer 22 and the second electrode layer 25. The buffer layer 23 may be made from a metal selected from the group consisting of Ti and Ta. Preferably, the buffer layer 23 is made from Ti.

More preferably, the base 2 further includes a diffusion barrier layer 24 that is formed between the buffer layer 23 and the second electrode layer 25. The diffusion barrier layer 24 may be made from TiN.

With respect to the manufacture of the ferroelectric memory device according to the present invention, for example, the ferroelectric layer 3 formed on the base 2 is made from PBNZ $((Pb_{1-x}Ba_x)(Nb_yZr_{1-y})O_3)$ and has a thickness of 150 nm. The first electrode layer 4 formed on the ferroelectric layer 3 is made from Pt.

The insulator layer 22 formed on the silicon substrate 21 of the base 2 is made from $SiO_2$ and has a thickness of 150 nm. The buffer layer 23 formed on the insulator layer 22 is made from Ti and has a thickness of 50 nm. The diffusion barrier layer 24 formed on the buffer layer 23 is made from TiN and has a thickness of 75 nm. The second electrode layer 25 formed on the diffusion barrier layer 24 is made from Pt and has a thickness of 150 nm.

Particularly, the ferroelectric layer 3 of PBNZ is formed on the second electrode layer 25 of Pt by co-sputtering in an argon ion plasma chamber under a working pressure of 5 mTorr. A power of 90 W is respectively applied to a $(Pb_{0.8}Ba_{0.2})ZrO_3$ ceramic target and a $(Pb_{0.8}Ba_{0.2})(Nb_{0.1}Zr_{0.9})O_3$ ceramic target. The ferroelectric layer 3 of PBNZ thus formed is then annealed by rapid thermal annealing (RTA) at 700° C.

The first electrode layer 4 formed on the ferroelectric layer 3 made of PBNZ can be patterned according to the required circuit layout to form a plurality of electrical contacts 41.

The ferroelectric memory device thus formed according to the above description was analyzed by inductively coupled plasma (ICP), and was found to have a composition of $(Pb_{0.8}Ba_{0.2})(Nb_{0.015}Zr_{0.985})O_3$.

Figure 2:
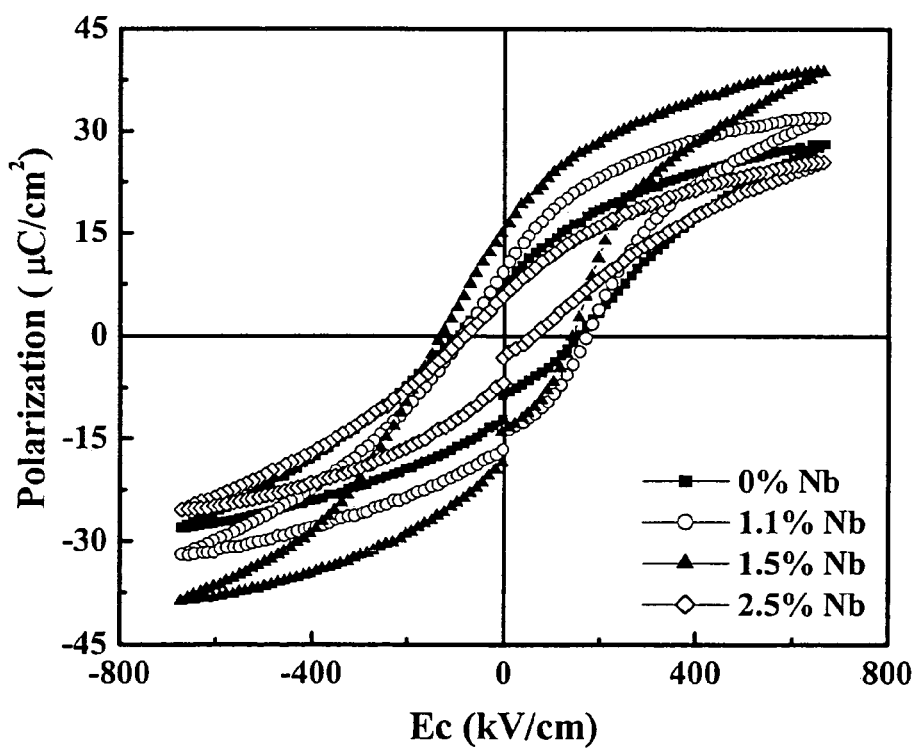
FIG. 2 is a plot of hysteresis loops of the preferred embodiment of FIG. 1.

Hysteresis loops of the ferroelectric memory device thus formed are illustrated in FIG. 2. According to the results shown in FIG. 2, when Nb at % of the ferroelectric layer 3 made of PBNZ increases to 1.5 at %, $E_c$ value increases only from 246 kV/cm to 270 kV/cm, which is not a significant change. However, Pr value is significantly increased with an increase in Nb at % of the ferroelectric layer 3 made of PBNZ. Particularly, when Nb at % of the ferroelectric layer 3 made of PBNZ is 1.5 at %, the $P_r$ value is greater than 15 $\mu C/cm^2$. In other words, when the applied electric field is zero, the ferroelectric memory device according to this invention can have a $P_r$ value greater than 15 $\mu C/cm^2$.

From the results shown in FIG. 2, it is apparent that through replacement of $Zr^{4+}$ with $Nb^{5+}$ in the ferroelectric crystal, the ferroelectric memory device having a relatively high $P_r$ value can be obtained.

Figure 3:
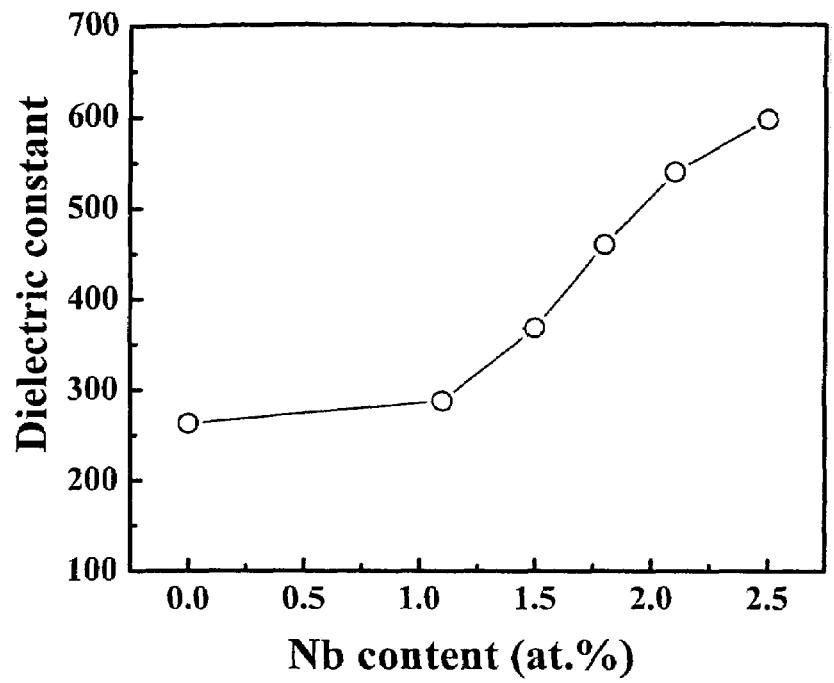
FIG. 3 is a plot to illustrate the relationship between dielectric constant and Nb content of the preferred embodiment of FIG. 1.

According to the results shown in FIG. 3, when Nb at % of the ferroelectric layer 3 made of PBNZ increases from 0% to 1.5 at %, dielectric constant of the ferroelectric memory device increases from 260 to 370.

Figure 4:
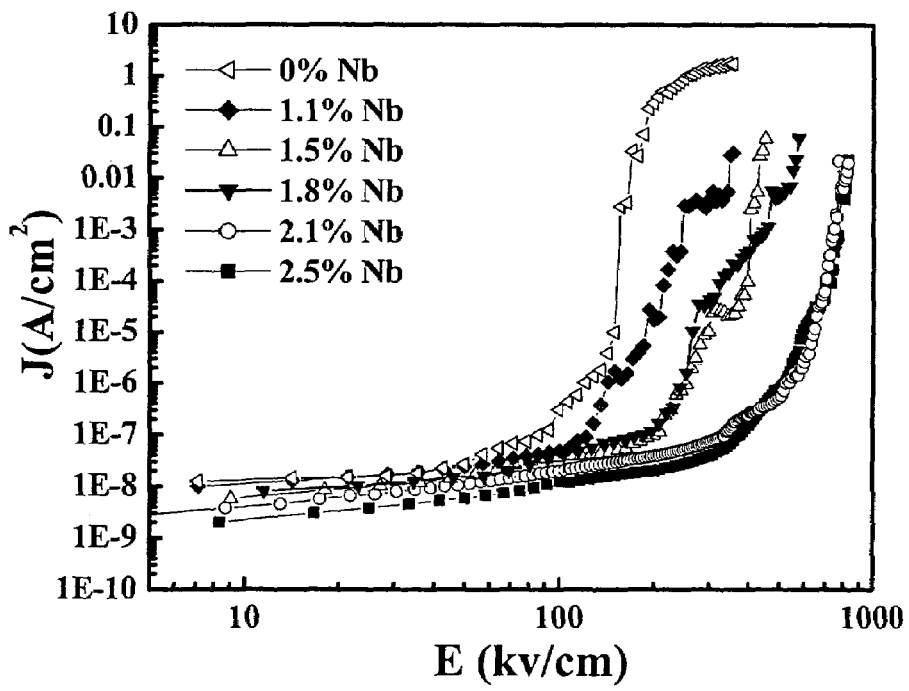
FIG. 4 is a plot to illustrate the relationship between leak current density and Nb content of the preferred embodiment of FIG. 1.

According to the results shown in FIG. 4, current density of the ferroelectric layer 3 made of PBNZ will decrease with an increase in Nb at %. In other words, leakage current of the ferroelectric memory device will decrease with an increase in Nb at % of the ferroelectric layer 3 made of PBNZ, and breakdown field of the ferroelectric memory device will decrease with an increase in Nb at % of the ferroelectric layer 3 made of PBNZ.

Figure 5:
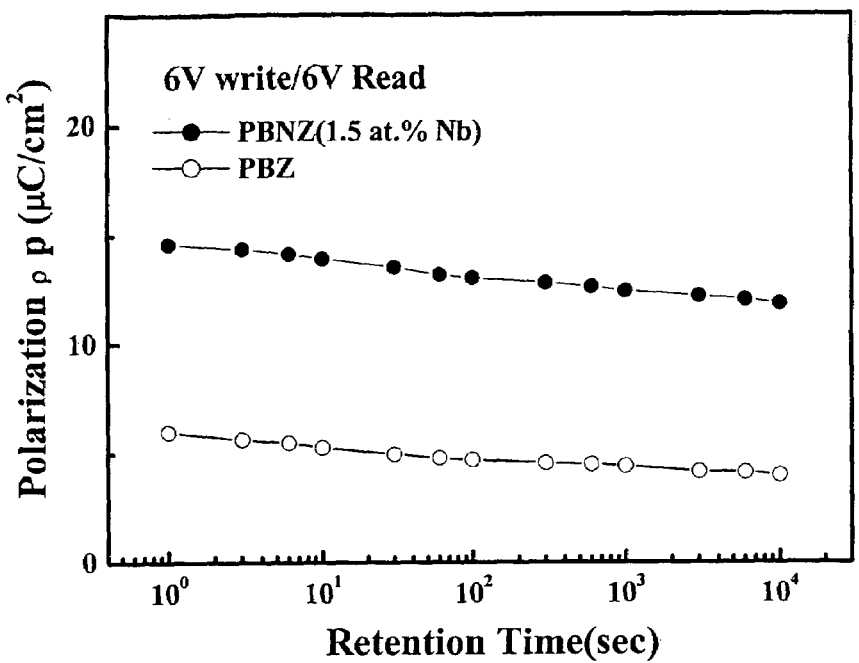
FIG. 5 is a plot to illustrate the relationship between switched polarization and retention time of the preferred embodiment of FIG. 1.

Referring to FIG. 5, the conventional ferroelectric memory device including a ferroelectric layer made of PBZ and the ferroelectric memory device including the ferroelectric layer 3 made of PBNZ (Nb at %=1.5 at %) of this invention are both written with a square wave pulse having a pulse width of 5 ms and read with a square wave pulse having a pulse width of 2 ms, for comparison in switched polarization. From the results shown in FIG. 5, the switched polarization ($\Delta P$) of the conventional ferroelectric memory device decreases from 6.0 $\mu$C/cm$^2$ to 4.1 $\mu$C/cm (decreases about 32%) during a retention time from 1 sec to 10$^4$ sec, whereas the switched polarization ($\Delta P$) of the ferroelectric memory device of this invention decreases from 14.6 $\mu$C/cm$^2$ to 11.9 $\mu$C/cm$^2$ (decreases about 20.0%) during a retention time from 1 sec to 10$^4$ sec. Apparently, the switched polarization ($\Delta P$) of the ferroelectric memory device according to this invention is lower than that of the conventional ferroelectric memory device.

Figure 6:
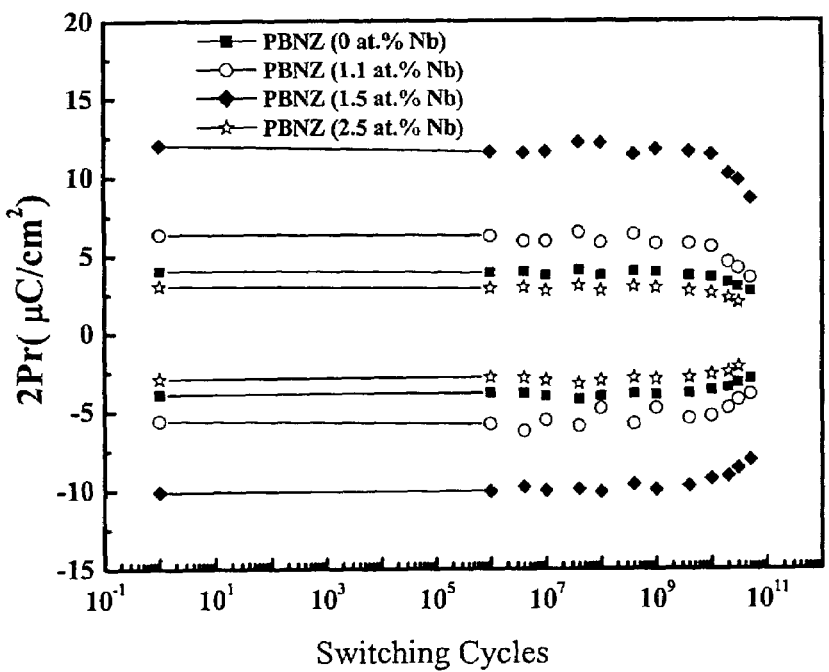
FIG. 6 is a plot to illustrate the relationship between net polarization and switching cycles of the preferred embodiment of FIG. 1.

Referring to FIG. 6, the ferroelectric layers of PBZ or PBNZ having different Nb at % were tested with bipolar pulse trains of ±6 V, using a square wave having a frequency of 1 MHz, so as to find out the relationship between Nb at % and net polarization 2P$_r$, as a function of switching cycles. From the results shown in FIG. 6, the net polarization of the ferroelectric memory device according to this invention (Nb at %=1.5%) is still higher than 10 $\mu$C/cm$^2$ after 10$^{10}$ switching cycles. However, for the conventional ferroelectric memory device (Nb at %=0), the net polarization is less than 5 $\mu$C/cm$^2$ after 10$^{10}$ switching cycles. Apparently, the ferroelectric memory device of this invention has a better ferroelectric characteristic than the conventional ferroelectric memory device.

In view of the aforesaid description and analysis tests, the ferroelectric material according to this invention is useful for manufacturing a ferroelectric memory device with good fatigue resistance and high remanent polarization.

While the present invention has been described in connection with what is considered the most practical and preferred embodiment, it is understood that this invention is not limited to the disclosed embodiment but is intended to cover various arrangements included within the spirit and scope of the broadest interpretation and equivalent arrangements.

What is claimed is:

1. A ferroelectric material comprising:
a compound of formula (I)

(Pb$_{1-x-z}$Ba$_z$A$_x$)(B$_y$Zr$_{1-y}$)O$_3$  (I)

wherein $0 \leq x \leq 0.1$, $0 \leq y \leq 0.020$, $0.15 \leq z \leq 0.35$, with the proviso that y≠0 when x=0, and that x≠0, when y=0; and wherein A is a first element having a valence number of three and is selected from the group consisting of La$^{3+}$, Nd$^{3+}$, Fe$^{3+}$, and combinations thereof, and B is a second element having a valence number greater than that of Zr.

2. The ferroelectric material as claimed in claim 1, wherein the second element has a valence number of 5 and is selected from the group consisting of Nb$^{5+}$, Ta$^{5+}$, V$^{5+}$, and combinations thereof.

3. The ferroelectric material as claimed in claim 2, wherein x=0, $0.01 \leq y \leq 0.018$, and the second element is Nb$^{5+}$.

4. A ferroelectric memory device, comprising:
a base;
a ferroelectric layer formed on said base, said ferroelectric layer being formed of a ferroelectric material including a compound of formula (I) as claimed in claim 1; and
a first electrode layer formed on said ferroelectric layer.

5. The ferroelectric memory device as claimed in claim 4, wherein said second element of said compound of formula (I) has a valence number of five and is selected from the group consisting of Nb$^{5+}$, Ta$^{5+}$, V$^{5+}$, and combinations thereof.

6. The ferroelectric memory device as claimed in claim 5, wherein, in formula (I), x=0, $0.01 \leq y \leq 0.018$, and the second element is Nb$^{5+}$.

7. The ferroelectric memory device as claimed in claim 4, wherein said base includes a silicon substrate, an insulator layer formed on said silicon substrate, and a second electrode layer disposed between said insulator layer and said ferroelectric layer, said second electrode layer being made from a conductive material selected from the group consisting of Pt, LNO, LSCO, SRO and YBCO.

8. The ferroelectric memory device as claimed in claim 7, wherein said insulator layer is made from SiO$_2$, and said conductive material is Pt.

9. The ferroelectric memory device as claimed in claim 8, wherein said base further includes a buffer layer that is formed between said insulator layer and said second electrode layer and that is made from a metal selected from the group consisting of Ti and Ta.

10. The ferroelectric memory device as claimed in claim 9, wherein said buffer layer is made from Ti.

11. The ferroelectric memory device as claimed in claim 10, wherein said base further includes a diffusion barrier layer that is formed between said buffer layer and said second electrode layer, and that is made from TiN.

* * * * *